United States Patent
Carlton

(10) Patent No.: US 6,667,930 B1
(45) Date of Patent: Dec. 23, 2003

(54) SYSTEM AND METHOD FOR OPTIMIZING PERFORMANCE IN A FOUR-BANK SDRAM

(75) Inventor: Stewart Carlton, Harvest, AL (US)

(73) Assignee: 3Dlabs, Inc., Ltd., Hamilton (BM)

( * ) Notice: Subject to any disclaimer, the term of this patent is extended or adjusted under 35 U.S.C. 154(b) by 0 days.

(21) Appl. No.: 10/172,461

(22) Filed: Jun. 12, 2002

Related U.S. Application Data

(60) Provisional application No. 60/346,563, filed on Jan. 8, 2002.

(51) Int. Cl.[7] .................................................. G11C 8/00
(52) U.S. Cl. ................................. 365/230.03; 365/238.5
(58) Field of Search ....................... 365/230.03, 238.5; 345/540

(56) References Cited

U.S. PATENT DOCUMENTS

| | | | | |
|---|---|---|---|---|
| 5,870,350 A | | 2/1999 | Bertin et al. ................. 365/233 |
| 6,000,019 A | * | 12/1999 | Dykstal et al. .............. 711/157 |
| 6,052,328 A | | 4/2000 | Ternullo, Jr. et al. ....... 365/233 |
| 6,070,217 A | | 5/2000 | Connolly et al. ............ 710/131 |
| 6,278,645 B1 | * | 8/2001 | Buckelew et al. ...... 365/230.01 |
| 6,297,832 B1 | * | 10/2001 | Mizuyabu et al. .......... 345/540 |

* cited by examiner

Primary Examiner—Richard Elms
Assistant Examiner—Tuan T. Nguyen
(74) Attorney, Agent, or Firm—Arnall Golden Gregory LLP

(57) ABSTRACT

An enhanced checkerboard pattern for optimizing performance when accessing a four-bank SDRAM. The screen is mapped using the enhanced checkerboard pattern, and each enhanced checkerboard pattern is composed of 16 squares. The enhanced checkerboard is made from two basic blocks, each block having 4 squares, and each square representing a distinct memory bank. The two basic blocks are mirror image of each other.

9 Claims, 4 Drawing Sheets

SYSTEM AND METHOD FOR OPTIMIZING PERFORMANCE IN A FOUR-BANK SDRAM

CROSS-REFERENCE TO RELATED APPLICATION

This application claims the benefit of U.S. Provisional Patent Application Serial No. 60/346,563, titled SYSTEM AND METHOD FOR OPTIMIZING PERFORMANCE IN A FOUR-BANK SDRAM, filed on Jan. 8, 2002, the entirety of which is hereby incorporated herein by reference.

BACKGROUND OF THE INVENTION

1. Field of the Invention

The present invention generally relates to computer systems. More specifically, the present invention relates to optimization of access in a synchronous dynamic random-access memory (SDRAM).

2. Description of the Related Art

Graphics-intensive applications for computers such as personal computers (PC's) are becoming increasingly more popular. Such applications include high-end computer-aided drafting (CAD) applications, games, real-time video applications, as well as other applications. As these applications become more complex, they require the computers on which they are executed to render graphics at an ever increasing rate. Furthermore, as the typical resolution of computer screens has increased from 640×480 pixels (horizontal times vertical) to 800×600, 1024 ×768 and beyond, and increased color information per pixel from two bits to 24 bits to 32 bits and beyond, the processing demand placed on the computers for fast graphics execution has also grown. The typical computer relies on a graphics card (also known as a video card, graphic accelerator card, or a display adapter, among other terms) for assistance in the display of graphics on a display device. A graphics card generally includes one or more specialized processors that are manufactured specifically for graphics rendering and processing graphics-related. The graphics card also typically includes memory, ranging from one, two, four, eight, sixteen megabytes and up, so that a complete screen of graphics information, known as a frame, can be stored by the graphics card. Thus, this memory is generally known as a frame buffer of the graphics card. Graphics "cards" may also be integrated within a single chip on a motherboard of a computer. A graphics card, potentially along with other components, makes up the graphics subsystem of a computer.

Initially, the memory of a graphics card was of the common type of dynamic random-access memory (DRAM) which is used by computer processors to hold data during processing. However, the access of data, i.e. the reading and writing of data to memory addresses, tends to be a slow process relative to the other processor components. Thus, as improvements in memory accessing speed have occurred in general memory hardware, such as the introduction of synchronous dynamic random-access memory (SDRAM), such improvements have also been included into graphics cards and graphics processing subsystems.

Specifically, a 2-bank SDRAM has been implemented in a graphics card to improve the memory access. With dual bank SDRAM, two different pages in memory may be open at the same time, one in each bank. FIG. 1 shows a prior art checkerboard arrangement 100 for a memory access using a 2-Bank SDRAMS. In this checkerboard arrangement 100, two adjacent locations are stored in two different memory banks. When drawing a figure, both banks 0 and I contribute one row of data, thus reducing latency in data accessing. The 2-bank SDRAM still does not possess adequate data throughput for modern graphics applications.

Accordingly, it would be advantageous to provide a system to further speed memory access in a graphics-intensive processor. It is thus to such a system that the present invention is directed.

SUMMARY OF THE INVENTION

The present invention discloses an enhanced checkerboard arrangement for 4-bank SDRAM. This enhanced checkerboard arrangement takes advantage of 4-bank SDRAM and improves performance in a computer system by reducing latency in memory access. The enhanced checkerboard arrangement groups memory banks in such way that four SDRAM memory banks form a basic block with four squares, where each square represents one memory bank. This arrangement particularly facilitates the drawing of small objects.

There are two basic SDRAM memory blocks, each formed by four memory banks. These two basic blocks are further arranged to form an enhanced checkerboard pattern composed of 16 squares, where four distinguished memory banks are aligned vertically. This arrangement facilitates the drawing of large objects.

Other objects, features, and advantages of the present invention will become apparent after review of the hereinafter set forth Brief Description of the Drawings, Detailed Description of the Invention, and Claims appended herewith.

DETAILED DESCRIPTION OF THE INVENTION

Figure 1:
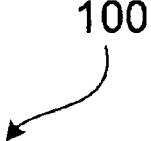
FIG. 1 is a checkerboard pattern for a 2-bank SDRAM (PRIOR ART).
Figure 2:
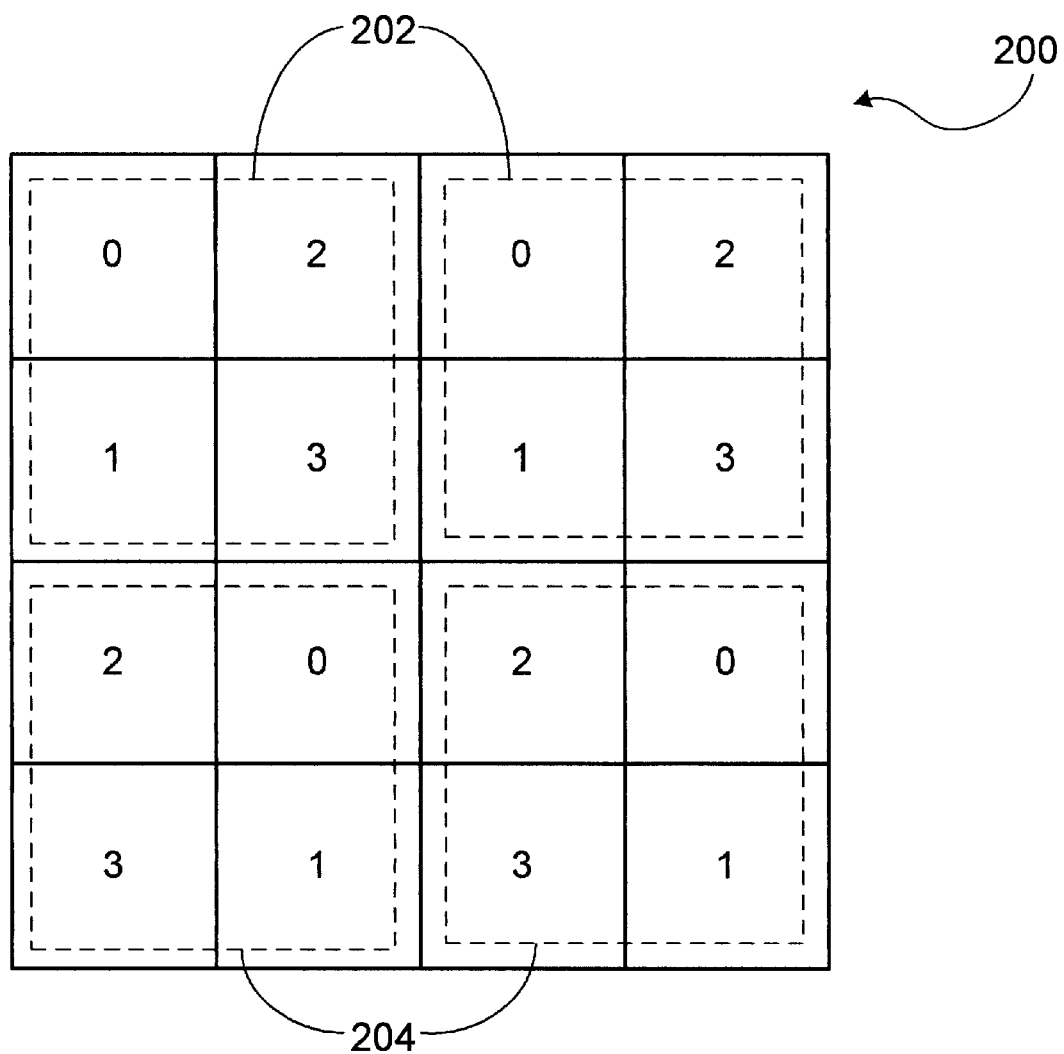
FIG. 2 is an enhanced checkerboard pattern for a 4-bank SDRAM according to the present invention.

Referring now in more detail to the drawings in which like numerals refer to like elements throughout the several figures, FIG. 2 is an enhanced checkerboard 200 according to the present invention. The enhanced checkerboard represents a display area and is divided into 16 squares. Each square represents a display area where the content of that area is stored in a single memory bank. Four adjacent squares form a basic block, and each square is stored in a different memory bank. The content of four squares can be stored in a 4-bank SDRAM, each square stored in a specific bank. The fact that 4 banks of SDRAM can be accessed simultaneously makes drawing the computer screen faster.

In the enhanced checkerboard shown in FIG. 2, there are two types of basic blocks, basic block 202 and basic block 204. Each basic block is a mirror image of other and each formed by four memory banks, 0, 1, 2, and 3. For the first type of basic block, each square is associated with a memory bank in a counter clockwise fashion, and for the second type of basic block, each square is associated with a memory bank sequentially in a clockwise fashion.

Each square in FIG. 2 represents a memory bank, and each square also represents an area of display screen. According to one embodiment of the present invention, each square represents an area covered by 32×8 pixels in a single processor system. The width of the area may be expanded in a multiple processor system. For example, for a two processor system, the area covered would be (32×2)×8 pixels.

Figure 3:
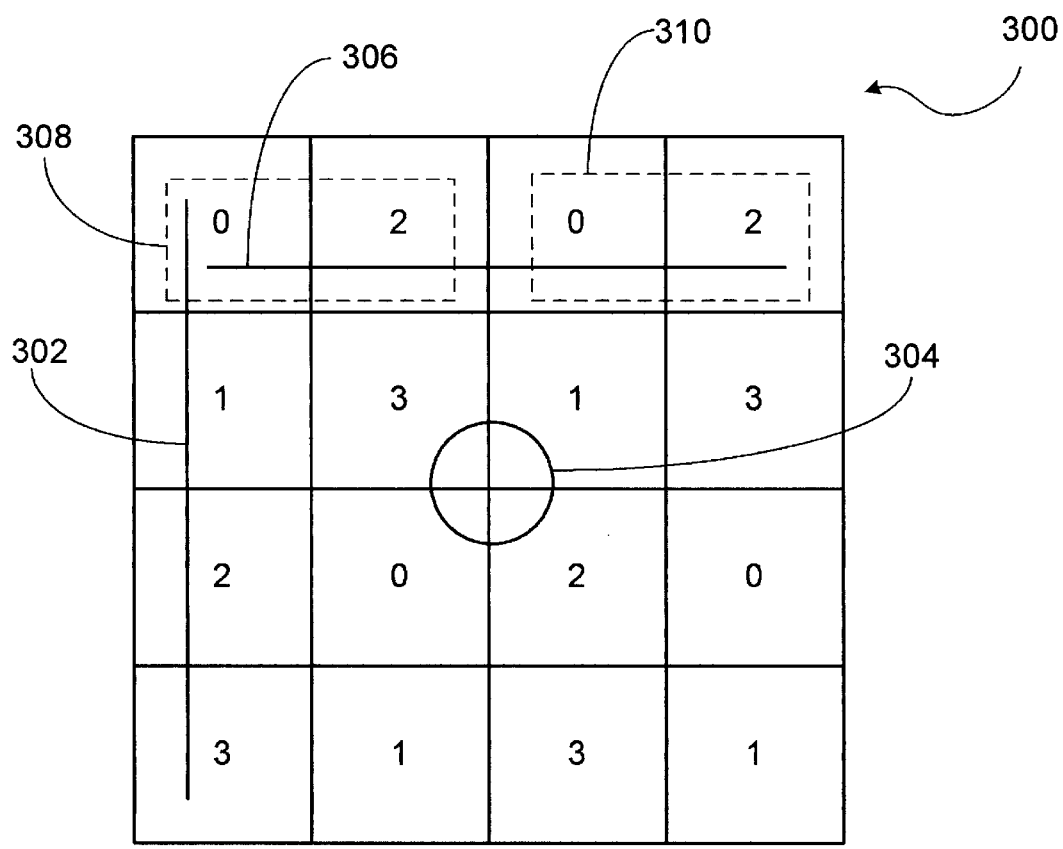
FIG. 3 is an enhanced checkerboard covering strips and circles.

When the basic blocks 202 and 203 are arranged in the pattern shown in the enhanced checkerboard 200, certain properties can be observed. When drawing vertical strips, all four banks of SDRAM can be accessed at the same time, thus minimizing latency in data access. For example, drawing a vertical line 302 in FIG. 3, all four banks, 0–3, are accessed at the same time with each memory bank outputting pixels from the same column. When drawing a localized figure that covers four squares, again all four banks of SDRAM can be accessed simultaneously. For example, a circle 304 in FIG. 3 covered by four squares is drawn by accessing four memory banks simultaneously. When drawing horizontal lines, only two memory banks are accessed simultaneously. For example, when drawing a horizontal line 306 in the area covered by four squares, two memory banks 308 are first accessed together to retrieve pixels from the same row, for example, row 0. Then the memory banks 310 are accessed to retrieve pixels from row 1.

Another characteristic of the enhanced checkerboard pattern is that any adjacent four squares, which form a larger square, are associated with four different memory banks. This ensures that any small objects covered by these four squares can be drawn with minimum latency by accessing all four memory banks simultaneously.

The present invention is useful in computer applications that employ intensive computer graphics. The computer screen is mapped with the enhanced checkerboard 200, and graphics information is distributed among 4 banks of SDRAM.

Figure 4:
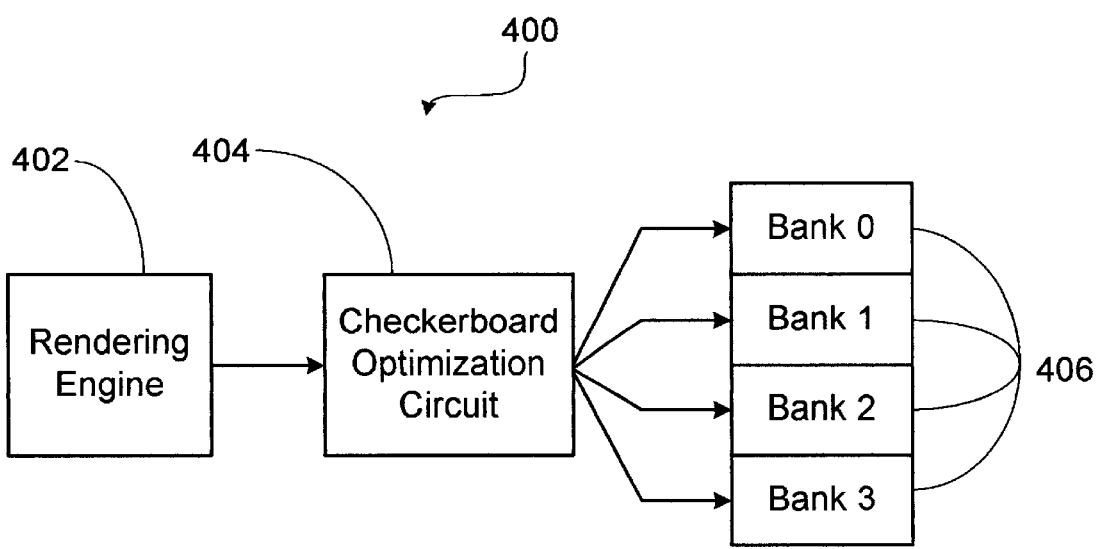
FIG. 4 is a block diagram of a logic circuit for accessing memory using an enhanced checkerboard according to the present invention.

FIG. 4 is a block diagram of a logic circuit 400 according to the present invention. The logic circuit 400 is preferably implemented on a graphics accelerator board. The rendering engine 402 interfaces with the central processing unit (CPU) and receives instructions and information from the CPU through a system bus. The rendering engine accesses the memory to store graphics information and to retrieve graphics information for display. The memory access is through a checkerboard optimization circuit 404. The checkerboard optimization circuit 404 decides which memory banks 406 to access based upon the specific objects to be drawn.

While the invention has been particularly shown and described with reference to preferred embodiments thereof, it will be understood by those skilled in the art that various other changes in form and detail may be made without departing from the spirit and scope of the invention.

What is claimed is:

1. An apparatus for accessing synchronous dynamic random access memory (SDRAM), the SDRAM having four memory banks, where each memory bank can be accessed independently, the apparatus comprising:
    a rendering engine receiving at least graphics-related information; and
    an checkerboard optimization circuit, the checkerboard optimization circuit receiving memory location information from the rendering engine and associating the memory location information with the memory banks in the SDRAM, the checkerboard optimization circuit associating the memory location information with the memory banks in the SDRAM by utilizing a checkerboard pattern wherein the checkerboard pattern is divided into 16 squares with each square associated with one memory bank, and the checkerboard formed by a first basic block and a second basic block, the first basic block being a mirror image of the second basic block, and each basic block being further formed by four squares.

2. The apparatus according to claim 1, wherein the checkerboard pattern is formed by two first basic blocks and two second basic blocks.

3. The apparatus according to claim 1, wherein the four squares of each basic block are associated with four different memory banks in the SDRAM.

4. The apparatus according to claim 1, wherein any four adjacent squares forming a larger square are associated with four different memory banks.

5. The apparatus according to claim 1, wherein any four vertical squares are associated with four different memory banks.

6. An apparatus for accessing synchronous dynamic random access memory (SDRAM), the SDRAM having four memory banks, where each memory bank can be accessed independently, the apparatus comprising:
    a rendering means for rendering graphics and generating graphics data; and
    a checkerboard means for optimizing a checkerboard of at least four memory banks for display of graphics data sent from the rendering means and associating a memory location information with the memory banks in the SDRAM.

7. A method for reducing latency in accessing a SDRAM with four memory banks, the SDRAM rendering graphics on a display comprised of pixels, the method comprising the steps of:
    forming a first basic memory block, the first basic memory block having four squares each comprised of a group of pixels, each square being associated with a memory bank;
    forming a second basic memory block, the second basic memory block having four squares each comprised of a group of pixels, and the second basic memory block being a mirror image of the first basic memory block; and
    forming a checkerboard pattern using two first basic memory blocks and two second basic memory blocks, wherein two first basic memory blocks are placed in opposing corners.

8. The method of claim 7, further comprising the step of associating each square in the first basic memory block with a memory bank sequentially in a counter clockwise fashion.

9. The method of claim 8, further comprising the step of associating each square in the second basic memory block with a memory bank sequentially in a clockwise fashion.

* * * * *